United States Patent [19]

Spierings

[11] 3,970,922

[45] July 20, 1976

[54] HALL-VOLTAGE DEVICE

[76] Inventor: Ferdinand Hubert Franciscus Gerardus Spierings, Wageningen, Netherlands

[22] Filed: Sept. 9, 1974

[21] Appl. No.: 504,658

[30] Foreign Application Priority Data

Sept. 13, 1973 Netherlands.......................... 7312638
Sept. 13, 1973 Netherlands.......................... 7312639

[52] U.S. Cl. ................................... 324/45; 310/11
[51] Int. Cl.² ..................... G01R 33/06; G21D 7/02
[58] Field of Search ............................ 324/45; 310/11

[56] References Cited
UNITED STATES PATENTS 3,348,487  10/1967  Miller ................................ 310/11

Primary Examiner—R. V. Rolinec
Assistant Examiner—Ernest F. Karlsen
Attorney, Agent, or Firm—Roylance, Abrams, Berdo & Kaul

[57] ABSTRACT

A Hall voltage device including means for generating a magnetic field and a rotatable box mounted within the field in the air gap defined by the means. The box is arranged to receive a fluid including charged particles and comprises appropriately located electrodes cooperating with the fluid and means for rotating the box. An end face of the box is provided with a central aperture around the axis of rotation for introducing the fluid into the box. In another embodiment the apparatus comprises a pivot having two parts, each part connected to a respective electrode of the box. Each part contacts an amount of mercury contained in a reservoir. The two reservoirs are connected to a voltage meter. Cooling means for the mercury reservoir is also disclosed.

5 Claims, 5 Drawing Figures

HALL-VOLTAGE DEVICE

The present invention relates to an improved Hall voltage device and constitutes an improvement over the apparatus described and claimed in U.S. Pat. No. 3,823,333 issued on July 9, 1974.

BACKGROUND OF THE INVENTION

The Hall voltage device described in the above patent comprises means included in a magnetic circuit for generating a magnetic field, a cylindrical box mounted between and substantially parallel to the planar boundaries of the air gap defined by the field generating means, which box is arranged to receive a fluid having charged particles distributed therein and which box includes electrodes located adjacent to its axis and its inner periphery, respectively, and adapted to cooperate with the fluid, and means for imparting to the box a rotational movement about its axis, which axis substantially coincides with the central axis of the magnetic circuit. The Hall voltage generated during operation of the device is collected through a pair of mercury contact systems, one of which cooperates with a pivot secured to the box into which the fluid to be examined can be introduced, while the other cooperates with a shaft also secured to the box and adapted to impart the rotational movements of the box during operation.

It has appeared that the collection technique employed with the earlier embodiments of the device is subject to failures which are partly the result of the operation of the device itself. Moreover, the contact system occupies considerable space.

In addition, in the previously disclosed device, the fluid can be introduced into the volume defined within the box only when the device is at a standstill, the fluid being introduced by means of, for example, a hypodermic needle. This method of introduction of the fluid is disadvantageous under certain circumstances if, for example, it is desired to establish a certain physical-chemical system in the box, which system may be composed of, in succession, mercury, calomel and the fluid to be examined.

An object the present invention is to provide an improved structure which permits introduction of fluid while the apparatus is rotating so as to make it possible to establish a physical-chemical sequential system in the box during rotation.

A further object of the present invention is to provide an improved structure of the mercury contact system which lacks the disadvantages of the previously disclosed apparatus.

SUMMARY OF THE INVENTION

Briefly described, the apparatus includes a rotating box having a central aperture surrounding the central member which supports and drives the box in rotary motion, forming an annular space through which fluid can be introduced during rotary movement. In another aspect of the invention, the box is provided with a pivot having two inter-fitting portions of a generally cylindrical and preferable conical shape, the outer surface of each of the inter-fitting parts having an electrically conductive coating connected to a respective electrode of the device, the outer coating of the outer part contacting a first mercury reservoir and the coating on the inner part contacting a second mercury reservoir by means of an electrode in the nature of a needle extending through the outer part and through an aperture in the first reservoir, the reservoirs being connected to a Hall voltage meter.

BRIEF DESCRIPTION OF THE DRAWINGS

In order that the manner in which the foregoing and other objects are attained in accordance with the invention can be understood in detail, particularly advantageous embodiments thereof will be described with reference to the accompanying drawings, which form a part of this specification, and wherein.

DESCRIPTION OF THE PREFERRED EMBODIMENT

Figure 1:
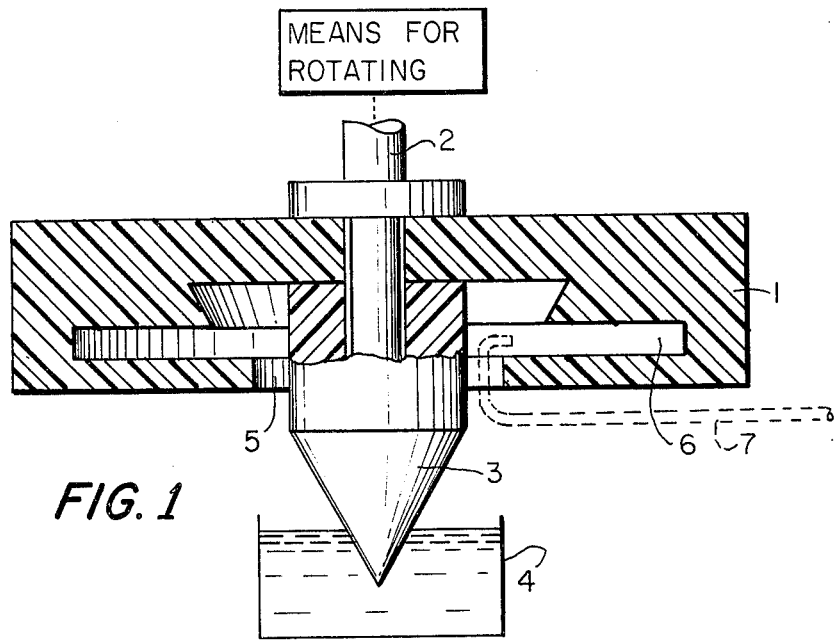
FIG. 1 is an elevation in section of a simplified apparatus according to the present invention showing a single chamber box structure.

As shown in FIG. 1, the apparatus includes a box 1 having a shaft 2 and extending downwardly through an aperture in the upper portion thereof, the shaft 2 being coupled to means for imparting rotary movement to the box and for supporting the box. The box is further provided with a pivot 3 which is generally cylindrical in nature but which has a lower conical end which is immersed in a pool of mercury contained in a reservoir 4. The mercury reservoir serves as a terminal of the measuring circuit, which is not shown in FIG. 1, but which will be discussed hereinafter, for measuring Hall voltage generated during operation of the device. It will be noted that the box is generally cylindrical and disc-like in outer configuration and is provided with a circular central aperture 5 of a diameter significantly larger than that of pivot 3, which pivot is secured to an inner under surface of the box and protrudes through opening 5. The significant aspect of this structure is that an annular space exists through which the fluid to be examined by this apparatus, as stated above, as well as additional substances can be inserted into the box into the interior cavity 6 as by, for example, a bent hypodermic needle during operation of the device while the box is rotating. A needle of this general type and the manner in which it can be employed is illustrated by the dotted lines 7.

In order to facilitate use of the arrangement including box 1 and the pivot 3 and shaft 2, together with the means for driving the shaft and the magnetic system which produces a magnetic field extending in a direction generally parallel to shaft 2 and the axis of rotation of the box, this apparatus including the box and its pivot and shaft should be adjustable in a vertical direction. However, as this adjustability can be accomplished in any appropriate manner, a specific apparatus is not disclosed for accomplishing same in order to maintain simplicity in the drawing.

Figure 2:
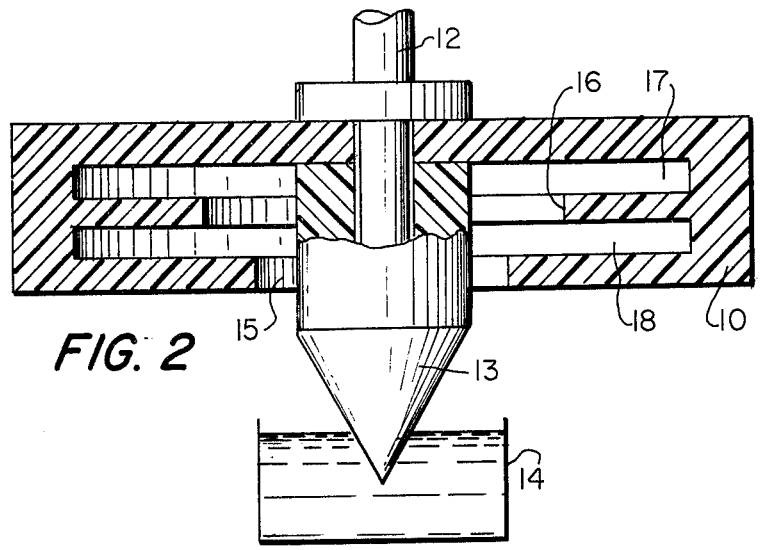
FIG. 2 is a side elevation of an apparatus similar to FIG. 1 and incorporating two chambers.

In order to permit the analysis and comparison of various types of fluids, a further embodiment in accordance with this aspect of the invention can be provided as shown in FIG. 2. In that figure, the body 10 is provided with a drive shaft 12 and pivot 13, similar to the apparatus of FIG. 1, with a mercury reservoir 14, the box being also provided with a central aperture 15 which surrounds pivot 13 and leaves an annular space for the insertion of fluids. The body 10 is provided, however, with a radially inwardly extending dividing wall 16 which separates the interior of the box into two chambers 17 and 18. The inner surface of wall 16 terminates significantly short of pivot 13 so that a large annular space remains.

In the actuation of either of these devices, it will be observed that the property of centripetal force is relied upon and that no interior wall retains the liquid in location. In other words, the box is rotated at a speed which is sufficient to cause liquid inserted therein to be held against the outermost radial walls of the interior chambers so that, in the case of the apparatus of FIG. 2, separate fluids can be placed in chambers 17 and 18 and, so long as rotation is maintained at a sufficient speed, the fluids will not interact until the volume thereof causes them to pass around the inner end of wall 16.

Although it is possible to provide an equivalent to the aperture 15 in the top of the box rather than in the bottom (in the case of either of FIGS. 1 or 2) in which case the bottom of the box would be closed, an arrangement of this type presents considerable difficulties in location of the pivot structure and connection of the apparatus to the rotation drive means. Accordingly, the structures shown in FIGS. 1 and 2 are preferred.

It will be observed that the structure shown in FIG. 2 can be employed, for example, for the purpose of comparing the properties of two different fluids. Thus, chamber 17 can be supplied with a dispersing agent including a dispersed phase, whereas chamber 18 can be provided with only the dispersing agent. In this manner it is possible to determine the properties of the dispersed phase by appropriately comparing the voltages produced by the respective fluids in chambers 17 and 18.

Figure 3:
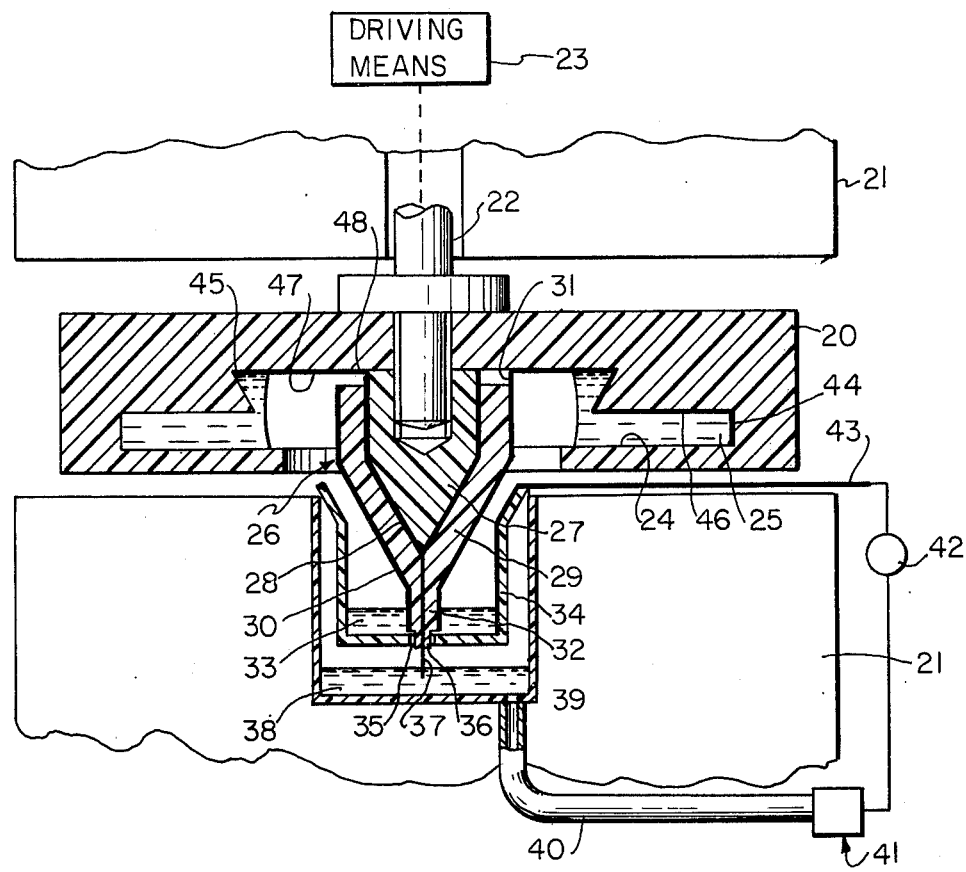
FIG. 3 is a side elevation of an apparatus according to the invention showing a more complete apparatus employing the box structure of FIG. 1 and including an electrode structure usable therewith.

Referring now to FIG. 3, there is shown therein a more complete diagram of the entire system, including a box of the type shown in FIG. 1, the unidirectional magnetic field generating means, and an electrode structure. As shown therein, a box 20 of insulating material having a substantially cylindrical configuration and an interior cavity similar to that shown in FIG. 1 is disposed within the air gap of a magnetic circuit including means for producing a magnetic field, a portion of which is illustrated at 21. The box 20 is secured at its top to a shaft 22 which is coupled to driving means schematically indicated at 23 for imparting rotary motion to box 20 and a portion of the associated structure. As previously indicated, the box is provided with a single interior cavity 24 adapted to receive fluid, indicated at 25, to be examined. The box also includes a pivot structure indicated generally at 26 secured to and rotatable with the box.

In accordance with the present invention, the pivot 26 is an assembly comprising an interior portion 27 constructed of an electrically nonconductive material and having a generally cylindrical shape with a pointed conical lower portion. This inner part 27 is provided with a coating 28 which is electrically conductive and which extends upwardly to the lower inner surface of cavity 24. Pivot 26 also has an outer portion 29, the outer surface of which is larger than, but of the same general shape as, portion 27 and an inner portion which is designed to mate with portion 27, being dimensioned sufficiently larger to encompass coating 28. Portion 29 is adhered or otherwise affixed to that coating so that the assembly forms a unitary structure. The upper portion of portion 29 terminates lower than the upper inner wall of cavity 4 and does not come in contact therewith.

The outer surface of portion 29 is provided with a coating 30 which is electrically conductive and which carries with it an electrode 31 which extends upwardly to approximately the upper limit of cavity 44.

Portion 29 carries with it a lower cylindrical extension 32, also of insulating material, which depends from what would otherwise be the pointed end of that portion, this extension being immersed in a body of mercury 33 contained in a first mercury reservoir 34. The reservoir 34 is appropriately supported by surrounding magnetic means 21 and may be detachable therefrom. The bottom of mercury reservoir 34 has a central aperture 35 through which a reduced extension 36 protrudes, extension 36 being closely dimensioned to the aperture to prevent significant leakage of mercury therethrough. It will be observed that conductive coating 10 extends onto and surrounds extension 32 so that it makes electrical contact with mercury 33 in the first reservoir.

The conductive coating 28 which is provided on the inner member 27 of the pivot structure 26 is provided with a needle-like electrically conductive extension 37 which protrudes beyond portion 36 and extends downwardly and is immersed in the mercury 38 in a second mercury reservoir 39 which is also appropriately supported by the structure of magnetic means 21.

The second mercury reservoir is connected through a conduit 40 to a mercury siphon and reservoir device indicated generally at 41 to a terminal of a voltage meter 42 in a manner similar to that shown in U.S. Pat. No. 3,823,333. Similarly, an electrode 43 electrically connects the mercury 33 in reservoir 34 to the other side of meter 42. Turning now to the electrical connections within box 20, it will be seen that the box is provided with electrodes 44 and 45, electrode 44 being located at a radially outermost portion of cavity 24 and electrode 45 being located at a radially relatively inwardly disposed location in the cavity. Electrode 44 is connected through a radially extending conductive strip 46 to electrode 31 which extends annularly and is connected to the outer coating. Electrode 45 is electrically connected through a radially inwardly extending strip 47 to a point 48 which constitutes an electrode connected to coating 28.

It will be clear that conductors 46 and 47 are necessarily electrically insulated from the surrounding environment and from the other electrodes.

The conductive strips 46 and 47 can be thin layers of silver paint so as to minimally interfere with the centripetal action during operation. The portions of the strips contacting the fluid are also coated with an electrically insulated material.

It will also be clear that the electrodes in the box may have any appropriate configuration. Thus, they may be disposed on the surface or, alternatively, may be located in recesses in appropriate surfaces of the chamber. Preferably, the outer electrode 44 is not disposed in contact with the extreme end or outer wall of the chamber but is slightly spaced therefrom so as to permit motion of the charged particles in the fluid to be tested past the electrodes.

Figure 4:
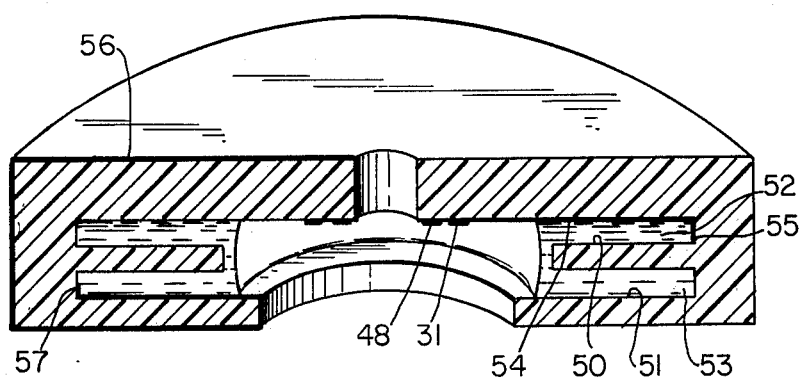
FIG. 4 is a perspective, in section, of a box structure in the nature of FIG. 2 showing an electrode arrangement usable with the apparatus of FIG. 3.

FIG. 4 shows an embodiment of the box similar in configuration to FIG. 2 but with the addition of an electrode and pivot structure such as that shown in FIG. 3. For simplicity, the pivot arrangement has not been reproduced, there being an indication only of the electrode and conductor arrangement. In FIG. 4, it will be seen that the box includes two chambers 50 and 51 adapted to receive two different fluids schematically indicated at 52 and 53, respectively. The annular terminal electrodes 31 and 48, discussed with reference to FIG. 3, are present also in this embodiment. Terminal electrode 31 is connected through a conductive strip 54 to electrode 55 disposed adjacent the annular inner wall of the upper cavity 50. Electrode 48 is connected through a conductive strip 56 which extends along the surface of the box as indicated in FIG. 4 to an electrode 57 disposed along the radially outward inner wall of the lower chamber 51.

As will be recognized, the Hall effect occurs when a charged particle is moving in one direction (e.g., the X direction) and a magnetic field is provided in a direction perpendicular thereto (e.g., the Y direction). A force resulting from these will then tend to move the charged particle in the Z direction. When a number of such particles exist, the resultant produces a potential difference which is known as the Hall effect voltage. In the present invention, the charged particles are dispersed in the fluid and are moved by spinning the box. The field is provided perpendicular to the plane of the box, thereby producing the Hall effect voltage in a radial direction.

It will be observed that the embodiment of the box as shown in FIG. 4 can be used when the dispersing agent has a particular composition in order to study the dispersed phase. In that case, the dispersing agent including the dispersed phase is contained in the upper chamber 50 while the lower chamber 51 contains only the dispersing agent.

It will be further clear that although in the structure of the box as shown in FIGS. 3 and 4 the bottom has a central aperture the edge of which is spaced from the outer surface of the pivot structure so as to permit the introduction of a fluid system into the box during rotation thereof, the pivot arrangement in accordance with the present invention may also be applied to a closed box as described in the previously referenced patent.

It has appeared to be advantageous to provide cooling means in connection with the apparatus disclosed herein. It appears that during the operation of one of these arrangements the mercury contacts are heated due to the fast rotation of the moving components. To avoid detrimental effects due to the heating of the mercury, it is preferred to provide at least one of the mercury reservoirs with a double wall and to equip the arrangement with means for circulating a coolant, such as water, between the two walls. It is feasible to provide also the upper part of the mercury siphon, described in detail in the referened patent, with such a double wall and thus cool it. Cooling means can be included in the coolant circulating system, thereby maintaining the temperature of the circulating coolant at a constant level.

Figure 5:
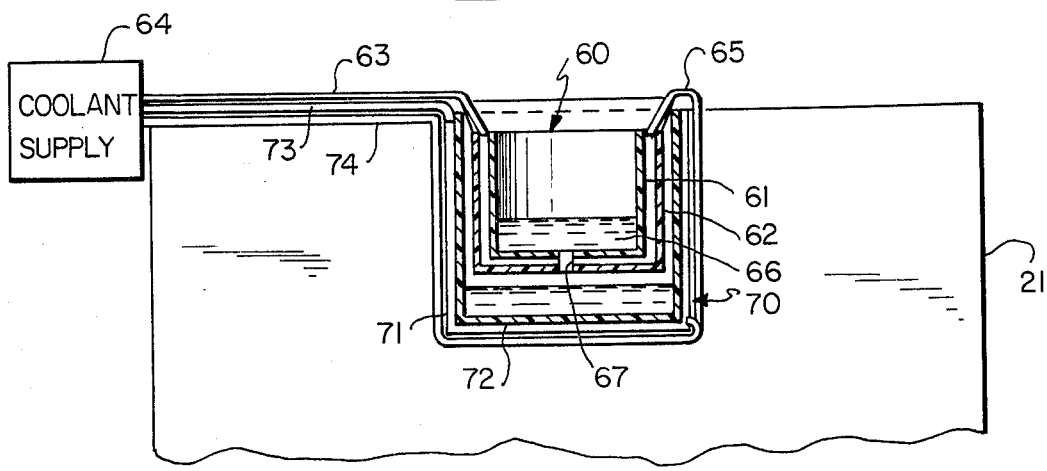
FIG. 5 shows schematically an elevation, in section, of double walled reservoirs and a cooling system.

A typical cooling apparatus of this type is shown in FIG. 5 wherein an inner reservoir indicated generally at 60 is seen to include an inner container 61, and an outer container 62, these two containers defining a volume therebetween which is connected by a conduit 63 to a coolant supply source 64 which can be a reservoir of a cooling liquid, such as water, and a suitable pumping apparatus. A conduit 65 is connected to a remote portion of the same volume to recirculate the liquid. Mercury 66 is contained within the inner container 61, as in the previous embodiments, and a tube 67 extends between the two walls of the container to isolate the mercury system from the cooling system. It will be observed that this conduit would be closed in a complete apparatus by the downwardly protruding extension on the pivot mechanism which is omitted from FIG. 5 for simplicity.

The apparatus can also comprise an outer reservoir indicated generally at 70 having an outer wall 71, an inner container 72 and conduit means 73 and 74 connecting the volume defined between these two containers with the coolant supply means 64.

Utilizing apparatus in accordance with the present invention it is possible to highly accurately measure the Hall voltages produced during operation of the arrangement, which measurements are reproducible in a reliable fashion.

Furthermore, the mercury container in any of the disclosed embodiments may have a funnel-shaped configuration instead of the cylindrical configuration shown, the tip of the funnel being directed downwardly. This permits a reduction of the amount of mercury in the container while maintaining proper contact between the mercury in this container and the conductive coating of the pivot. This reduction has certain advantages in connection with the renewal of the mercury during operation of the device.

While certain advantageous embodiments have been chosen to illustrate the invention it will be understood by those skilled in the art that various changes and modifications can be made therein without departing from the scope of the invention as defined in the appended claims.

What is claimed is:
1. In a Hall voltage device of the type having a magnetic system for defining and generating a magnetic field in an air gap, a cylindrical box mounted between and substantially parallel to the planar boundaries of the air gap defined by the magnetic system, the box having an interior cavity arranged to contain a fluid having charged particles distributed therein, the box including electrodes located adjacent to its axis and the outer periphery of the cavity, respectively, and adapted to cooperate with said fluid, and means for imparting to the box a rotational motion about its axis, said axis substantially coinciding with the central axis of said magnetic circuit, the improvement comprising
    means in an end face of said box defining an aperture centered on said axis for introducing said fluid into said box while said box is rotating.
2. A device according to claim 1, wherein said aperture is provided in the end face of said box remote from said means for imparting rotational movement to said box.
3. A device according to claim 2 wherein
    said electrodes are connected through mercury contact systems to a Hall voltage meter, the improvement comprising
    a pivot mounted for rotation with said box,
       said pivot including inner and outer portions each formed from electrical insulating material and fitting into each other, the outer surface of each of said portions having a conductive coating connected to a respective electrode of said device, a first mercury reservoir, the outer coating of said outer portion contacting said first mercury reservoir, a second mercury reservoir, and means connected to the coating on said inner portion for contacting said second mercury reservoir, said means comprising a needle extending through the outer part of the pivot and an aperture in said first mercury reservoir, each of said reservoirs being connected to said Hall voltage meter.

4. In a Hall voltage device of the type having a magnetic circuit for defining and generating a magnetic field in an air gap, a box mounted between and substantially parallel to the planar boundaries of the air gap defined by the magnetic circuit, the box having an interior cavity to receive a fluid having charged particles distributed therein, and means for imparting to said box a rotational movement about its axis, said axis substantially coinciding with the central axis of the air gap in the magnetic circuit, the box including electrodes located adjacent to the axis thereof and the outer periphery of the cavity, respectively, adapted to cooperate with said fluid, said electrodes being connected through mercury contact systems to a Hall voltage meter, the improvement comprising a pivot mounted for rotation with said box, said pivot including inner and outer portions each formed from electrical insulating material and fitting into each other, the outer surface of each of said portions having a conductive coating connected to a respective electrode of said device, a first mercury reservoir, the outer coating of said outer portion contacting said first mercury reservoir, a second mercury reservoir, and means connected to the coating on said inner portion for contacting said second mercury reservoir, said means comprising a needle extending through the outer part of the pivot and an aperture in said first mercury reservoir, each of said reservoirs being connected to said Hall voltage meter.

5. A device according to claim 4, wherein at least one of said mercury reservoirs has a double wall and said device further comprises means for circulating a coolant through the volume formed by said double wall.

* * * * *